United States Patent
Vatariu et al.

(10) Patent No.: US 10,674,626 B2
(45) Date of Patent: Jun. 2, 2020

(54) SCALABLE STRUCTURE FOR CONNECTION OF POWER SUPPLY UNITS

(71) Applicant: TDK-LAMBDA LTD, Karmiel Industrial Zone (IL)

(72) Inventors: Jakob Vatariu, Karmiel (IL); Arie Lev Girshson, Kiryat Bialik (IL)

(73) Assignee: TDK-LAMBDA LTD, Karmiel Industrial Zone (IL)

( * ) Notice: Subject to any disclaimer, the term of this patent is extended or adjusted under 35 U.S.C. 154(b) by 254 days.

(21) Appl. No.: 15/693,895

(22) Filed: Sep. 1, 2017

(65) Prior Publication Data

US 2019/0037723 A1   Jan. 31, 2019

(30) Foreign Application Priority Data

Jul. 26, 2017  (IL) ........................................... 253673

(51) Int. Cl.
| | |
|---|---|
| H02M 3/04 | (2006.01) |
| H05K 7/14 | (2006.01) |
| H02J 13/00 | (2006.01) |
| H02J 1/12 | (2006.01) |
| H02J 1/04 | (2006.01) |
| H02J 1/06 | (2006.01) |

(52) U.S. Cl.
CPC .............. *H05K 7/1457* (2013.01); *H02J 1/04* (2013.01); *H02J 1/12* (2013.01); *H02J 13/0003* (2013.01); *H02M 3/04* (2013.01); *H05K 7/1447* (2013.01); *H02J 1/06* (2013.01)

(58) Field of Classification Search
CPC .. H02J 1/04; H02J 1/12; H02J 13/0003; H02J 1/06; H02M 3/04; H05K 7/1447; H05K 7/1457
USPC ........................................................... 307/24
See application file for complete search history.

(56) References Cited

U.S. PATENT DOCUMENTS

| | | | |
|---|---|---|---|
| 2004/0189251 A1* | 9/2004 | Kutkut | H02J 7/022 320/128 |
| 2005/0275290 A1 | 12/2005 | Inn et al. | |
| 2015/0349534 A1 | 12/2015 | Lin | |
| 2016/0342546 A1 | 11/2016 | Sonnaillon | |
| 2017/0093209 A1* | 3/2017 | Banno | H02J 9/061 |

FOREIGN PATENT DOCUMENTS

WO   2016049384 A1   3/2016

OTHER PUBLICATIONS

European Search Report dated Jun. 22, 2018 in corresponding European Application No. 17189712.7 (8 pages).

* cited by examiner

*Primary Examiner* — Thienvu V Tran
*Assistant Examiner* — Brian K Baxter
(74) *Attorney, Agent, or Firm* — Venable LLP; Jeffri A. Kaminski

(57) ABSTRACT

The invention relates to a master-slave power supply system, which comprises: (a) a master power supply unit having an output power port; (b) one or more slave units, each unit having its own power port; wherein the output power port of the master unit, as well as the output ports of all the slave units are connected in parallel; and wherein a bridging cable connects between the master unit and a first slave unit, and additional bridging cables connect respectively each of the slave units to a next one, until a last slave unit, and wherein at least a voltage feedback signal is conveyed from master unit to all the slave units in parallel over said bridging cables.

19 Claims, 9 Drawing Sheets

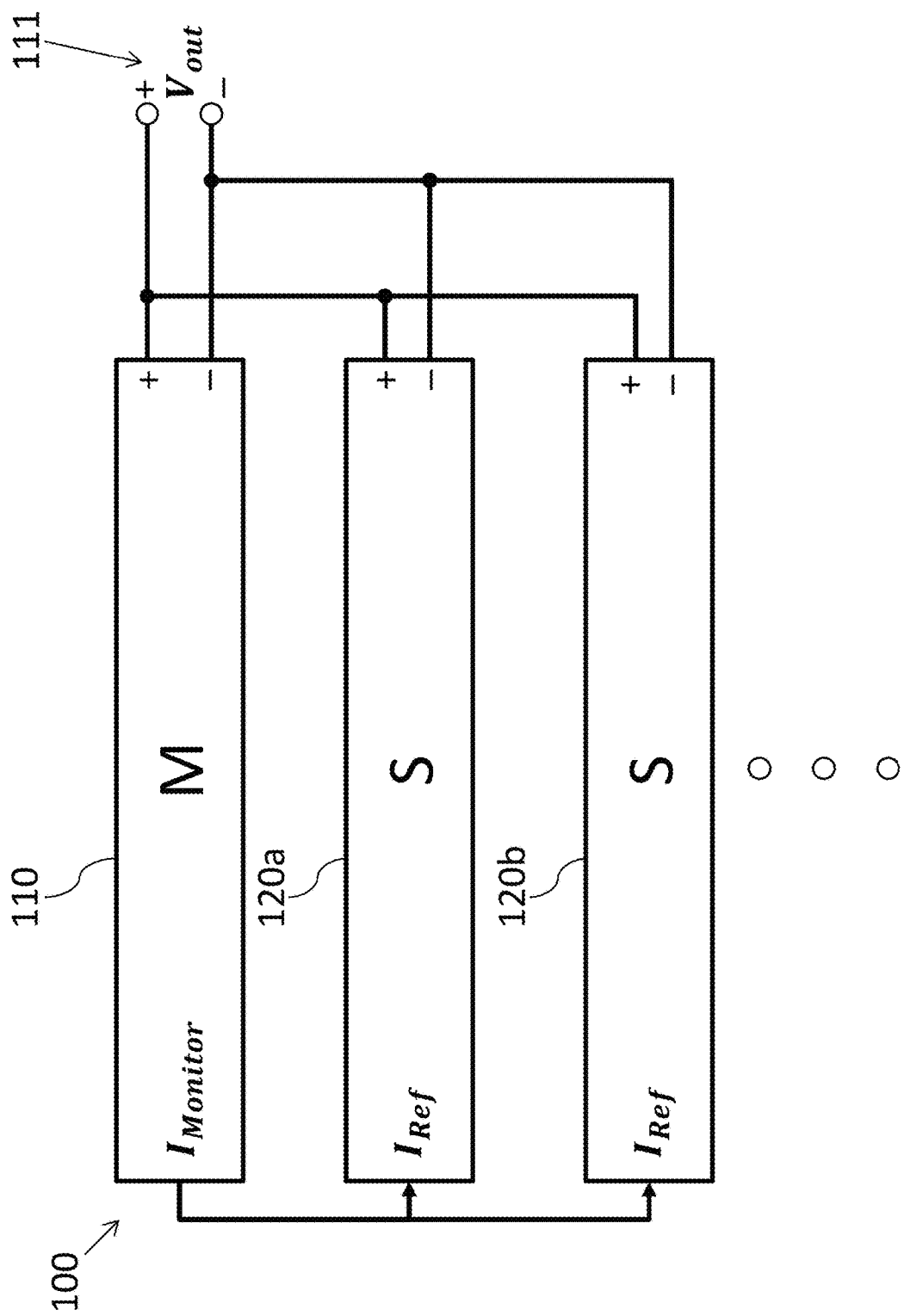
FIG. 1 – PRIOR ART

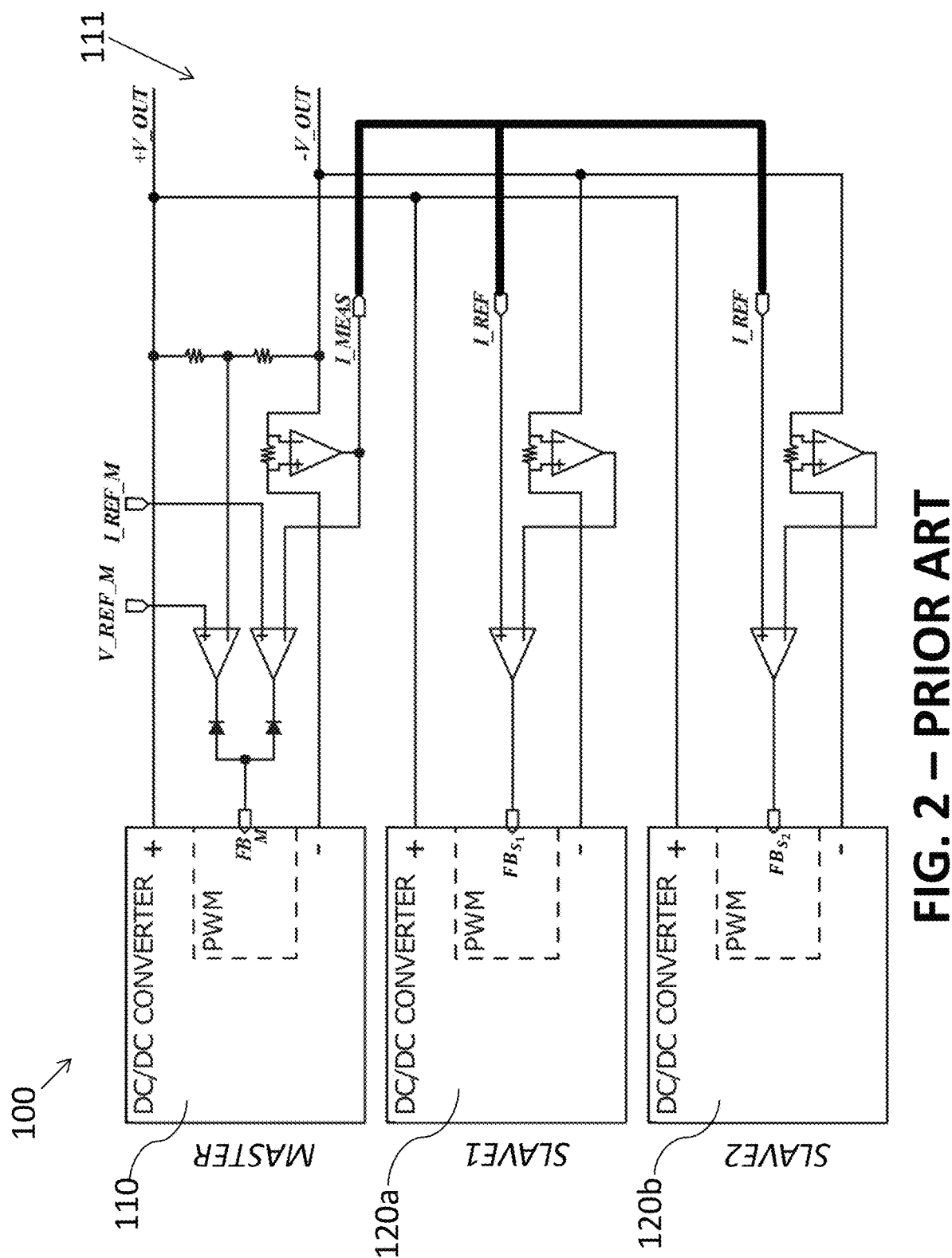
FIG. 2 – PRIOR ART

SCALABLE STRUCTURE FOR CONNECTION OF POWER SUPPLY UNITS

FIELD OF INVENTION

The invention relates in general to the field of power supplies. More specifically, the invention relates to a scalable structure for connecting plurality of power supplies, mainly those that are rack mounted, in parallel.

BACKGROUND OF THE INVENTION

Rack mounted power supplies are well known and are widely used for supplying DC power to nearby devices. For example, 19" and 9.5" racks are very widely used. Each of such power supplies is in fact a unit which is designed to supply voltage and current, in levels as specified by the user. Each power supply unit generally comprises an AC to DC stage, a DC to DC converter (which is fed, for example, from a Pulse Width Modulation-PWM circuitry), and a controller for regulating the output levels of the power supply and for managing the entire operation of the unit. Typically, each unit is composed of several substantially identical power modules, all of which are regulated and controlled by said single controller.

Although reference is made herein to rack mounted power supplies, this should not be viewed as a limitation, as the invention is applicable also to power supplies that are not rack mounted.

Typically, each power supply may operate in a constant-voltage (CV) mode which is the most common operational mode, or in a constant-current (CC) mode (in which the output acts as a current source).

Each of such power supply units is also typically designed to operate either as a stand-alone entity, or in a combination with other similar units. More specifically, when a necessity arises for a supply of more power than can be supplied by a single unit, several of such units are commonly connected in parallel.

The prior art has provided a configuration for connecting plurality of power supply units in parallel. In such a configuration, a first power supply unit is defined as "master", while each of the additional units is defined as "slave". The output ports (positive and negative) of all the units are respectively joined in parallel such that the combined configuration results in a single output pair, while each of the units contributes its own current to the load. In this configuration, the master unit is set to a specific output voltage level (and sometimes also a limitation to the current level is set), while it also generates a "monitor" output signal which is fed to each of the slave units. This "monitor" signal, in fact, reflects the level of current that the master unit supplies to the load, while each of the slave units uses this signal to regulate its own output current to match said level of the master unit current. In such a manner, all the slave units in fact operate in a current-feedback (current follower) mode, while the master unit operates in a voltage-feedback mode.

The above master-slave configuration in which the master unit operates in a voltage feedback mode, while all the slaves operate in a current-follower mode (current feedback that enforces the current of the slave unit to "follow" the current level of the master unit) suffers from a significant drawback: The slave units follow the output of the master unit in a very slow manner—for example, in transient events in which a fast and significant change in the current consumption occurs, the master unit operating in a voltage-feedback mode reacts to this change in a fast manner, while each of the slave units reacts in a much slower manner, which affects the performance of the entire system. For example, upon a fast increase in the current consumption from the system, the output voltage may initially decrease and then relatively slowly return to its specified output voltage. On the other hand, in the master unit this process occurs very fast. A similar problem occurs during soft adjustment of the master unit voltage and current levels by the user. In both of said cases the imbalance in the performance between the master and the slave units significantly affects the dynamic performance of the entire combined system, which in fact does not react to transients like a single unit operating alone.

In still another aspect, the configuration of the prior art master-slave system is quite cumbersome, as it requires the user to provide both soft configuration definition (such as defining the "master" and "slave units" via a UI or the front panel), and a hard-wire configuration, namely connecting multiple wires at the back panels.

It is therefore an object of the present invention to provide a master-slave power-supply system which reacts to dynamic transient consumption in a much faster manner compared to similar prior art master-slave systems.

It is another object of the present invention to provide a system in which the power consumption from the various units and modules is much more balanced compared to the prior art.

It is still another object of the present invention to provide a master-slave power supply system which is homogenous, operating like a single unit.

It is still another object of the present invention to provide a master-slave power supply system which is scalable to include any number of slave units.

It is still another object of the present invention to provide a master-slave power supply system which can be configured in a fast and simple manner, with no need for user setup via a user interface.

Other objects and advantages of the present invention will become apparent as the description proceeds.

SUMMARY OF THE INVENTION

The invention relates to a master-slave power supply system, which comprises: (a) a master power supply unit having an output power port; (b) one or more slave units, each unit having its own power port; wherein the output power port of the master unit, as well as the output ports of all the slave units are connected in parallel; and wherein a bridging cable connects between the master unit and a first slave unit, and additional bridging cables connect respectively each of the slave units to a next one, until a last slave unit, and wherein at least a voltage feedback signal is conveyed from master unit to all the slave units in parallel over said bridging cables.

In an embodiment of the invention, each of the system units is automatically defined as "master", "slave", or "last slave" depending on the manner of connection of said bridging cables to each of the units, respectively.

In an embodiment of the invention, at a CV (constant voltage) mode of operation, each of the slave units regulates its own output voltage, which is supplied to its output power port based on said voltage feedback signal which is received from the master unit.

In an embodiment of the invention, said bridging cables also convey a reference current signal from the master unit to each of the slave units, for use in a CC (constant current) mode of operation.

In an embodiment of the invention, the master unit and each of the slave units comprises an ORing circuit enabling the unit to autonomously decide whether to operate in a CV mode or in a CC mode, wherein the ORing circuit is configured differently at the master unit compared to the respective configuration of the ORing circuit at each of the slave units.

In an embodiment of the invention, at each of the slave units, said autonomous decision depends, among others, on the level of the voltage feedback which is received from the master unit.

In an embodiment of the invention, at the master unit the autonomous decision depends on the level of the voltage feedback which is also sent to each of the slave units and on the level of the internal current feedback.

In an embodiment of the invention, the master unit also conveys to each of the slave units an Iav signal, notifying the slave units the current level which is expected from each of the units.

In an embodiment of the invention, the master unit and each of the slave units comprises a plurality of internal power modules, and wherein a controller at each of the units calculates an internal average current for each of the modules.

In an embodiment of the invention, the master unit calculates a unit average current for each of the slave units, said unit average current is calculated based on a measured output current that each of the slave units conveys to the master unit.

In an embodiment of the invention, the master unit displays the total current of the system based on said output currents of the slave units, and its own output current.

In an embodiment of the invention, said bridging cables also convey status and fault signals between the master and the slave units.

In an embodiment of the invention, the setting of the system, as well as readback from the system refers to the system as a single unit regardless of the number of slave units connected.

In an embodiment of the invention, a setting at each slave unit is inhibited, enabling setting of the system only at the master unit.

In an embodiment of the invention, data and/or feedback exchange between the units is performed either in a wired form or wirelessly.

In an embodiment of the invention, current feedback between the units is exchanged either in a digital manner or in an analogue manner.

In an embodiment of the invention, the ON/OFF power switch of each of the slave units is inhibited based on said bridging cable, or based on a wireless digital signal which is conveyed from the master unit to each of the slave units.

In an embodiment of the invention, the identification of each of master or slave units is performed based on said bridging cable, or based on a wireless digital signal which is conveyed from the master unit to each of the slave units.

In an embodiment of the invention, the system further automatically configures itself into a scalable power system without human intervention.

BRIEF DESCRIPTION OF THE DRAWINGS

In the drawings:

FIG. 1 illustrates a typical configuration of a master-slave power supply system 100 according to the prior art;

FIG. 2 shows in more details the structure of the prior art system of FIG. 1;

DETAILED DESCRIPTION OF PREFERRED EMBODIMENTS

Figure 3A:
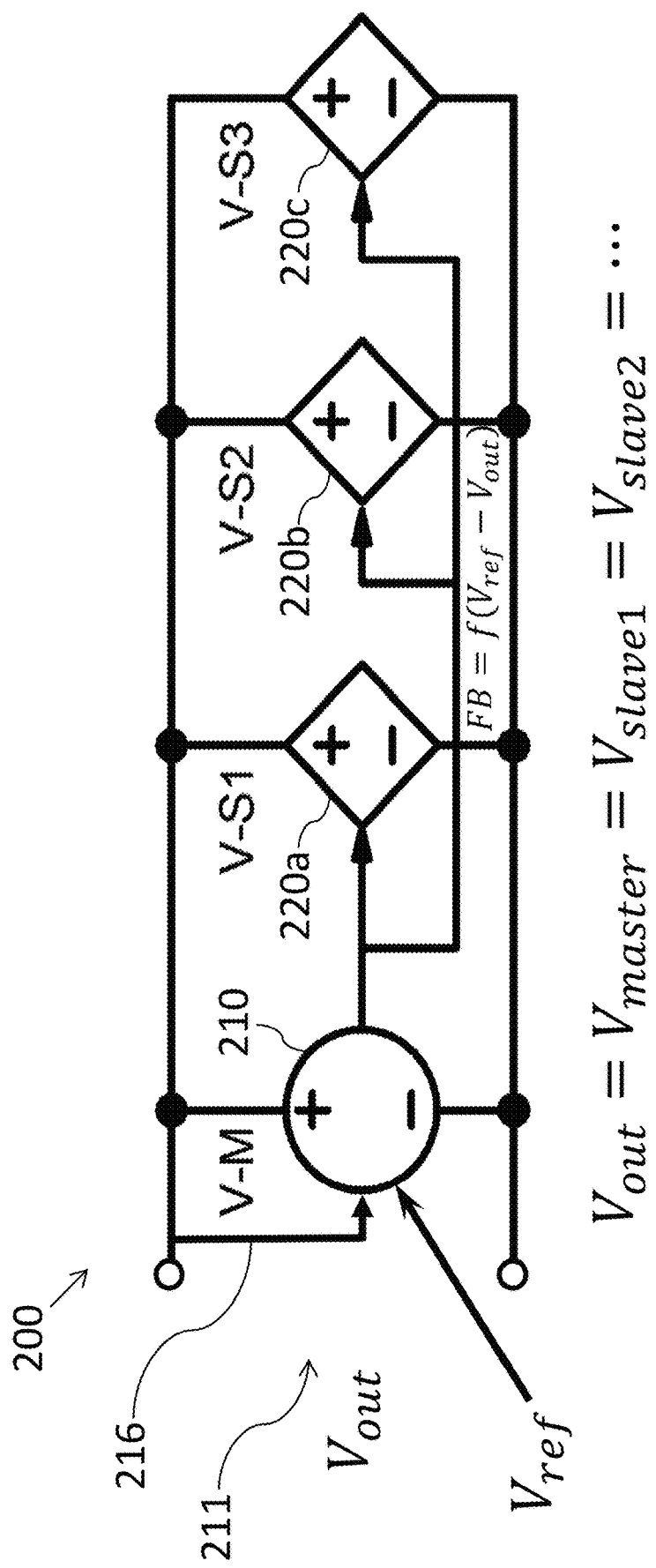
FIG. 3*a* illustrates a basic structure of a master-slave system, according to an embodiment of the present invention.

FIG. 1 illustrates a typical configuration of a master-slave power supply system 100 according to the prior art. As noted, a master-slave power supply system is typically used when a single power supply unit cannot meet an anticipated power consumption. The system 100 comprises a single master unit 110, and plurality of slave units 120*a*, 120*b*, etc,—all said power supply units are connected in parallel. The user typically defines the unit 110 as "master", and the units 120 as "slaves" by means of a user interface (UI). The user also defines by means of a UI at the master unit a specific desired output voltage $V_{out}$, and a total current limitation $I_{out}$ to be supplied via the combined output port 111. The master unit 110 of the prior art system 100 continuously supplies an $I_{monitor}$ signal to each of the slave units 120. The $I_{monitor}$ signal provides a relative amplitude which represents the level of the output current of the master unit 110. For example, if a maximal current of 2 Amperes from the master unit is represented by an amplitude of 5V, actual current consumption of 1 Ampere leads to an $I_{monitor}$ signal of 2.5V. The $I_{monitor}$ signal is fed into an $I_{ref}$ input in each of the slave units 120. Having this $I_{ref}$ input, each of the slave units operating in a current-follower mode, aligns its own output current relative to the output current from the master unit, and as a result of this configuration, the output voltage from port 111 is also aligned to the voltage as set by the user at the master unit. The output current from the prior art combined system equals to $I_{out}=(I_{master}\ I_{slave1}+I_{slave2}+I_{slave3}+\ldots$ etc.). As could be realized, the master unit of system 100 operates in a voltage-feedback mode to supply the output voltage as defined by the user, while each of the slave units 120 operates in a current follower mode to follow the $I_{monitor}$ issued by the master 110, inserted via $I_{ref}$ input of each slave unit 120. The inventors have realized that the two different modes of feedback-operation between the master unit and the slave units lead to a relatively poor reaction to transients in the power consumption of the combined system, particularly when compared to the operation of a single unit alone operating in voltage feedback (namely, in a constant voltage (CV) mode). It should be noted that typically a power supply operating in a voltage-feedback mode reacts much faster to transients in power consumption compared to a power supply operating in a constant current mode, and the fact that all the slave units of system 100 operate in a current feedback mode causes a significant degradation in the performance of the combined system.

It should be noted that, while the combined prior art system 100 may operate in either a constant voltage (CV) mode or in a constant-current (CC) mode, the above drawback of degraded performance exists in both of its said modes of operation, as even when the combined system operates in CV mode, its slave units operate in the slow reaction of CC (current-feedback) mode.

FIG. 2 shows in somewhat more details the structure of the prior art system 100. The V_REF_M and I_REF_M inputs are the voltage and current reference values as entered by the user via the UI. The output power is provided via port 111. The I_MEAS signal reflects the output current of the master, and this signal is provided into the I_REF inputs of both the slave units slave$_1$ and slave$_2$. Each of the master and slave units comprises a PWM (pulse width modulation) circuit, which feeds a respective DC to DC (DC/DC) converter. As can be seen, the feedback input $FB_M$ of the master 110 depends on the V_REF_M and I_REF_M signals respectively (depending whether the master operates in a CV or CC mode, respectively). On the other hand, each of the inputs $FB_{S1}$ and $FB_{S2}$ of the slave units 120 depends on the I_MEAS signal, which reflects the output current of the master unit 110, as provided to the I_REF input of each of the slave units, respectively. As a result, each of the slave units matches its output current (in the accuracy possible) to the output current from the master unit 110. As said, the output voltage in port 111 is dictated by the output voltage from the master unit 110. It should be noted that the system of the invention may theoretically include any number of "slave" units.

FIG. 3a illustrates a basic structure of a master-slave system 200, according to an embodiment of the present invention, while the system operates in a CV mode. The system 200 comprises a master unit 210, and plurality of slave units 220a, 220b, 220c, etc. The user defines the desired $V_{ref}$ output voltage at the master unit 210 via a UI, similarly as done in the prior art system 100. Furthermore, the master unit outputs a voltage feedback signal to each of the slave units 220, namely, [FB=f($V_{ref}$-$V_{out}$)]-$V_{out}$ being the voltage at the combined output power port 211 of all the units connected in parallel. As shown, in the CV mode all the units of the system operate in a voltage-feedback manner. More specifically, the master unit 210 receives a $V_{meas}$ signal 216 which reflects the combined output voltage. The master unit uses the $V_{meas}$ signal internally as a feedback to correct the variations of the output compared to the desired $V_{ref}$ voltage, and to issue said feedbacks to each of the slave units 220. The master unit also conveys to each of the slave units a, $I_{av}$ signal, which is discussed hereinafter with respect to FIG. 3b. As shown, in CV mode, all the units of system 200 operate in a voltage-feedback manner. The system 200 may also operate in a constant current mode, in a manner which will be described in more details hereinafter.

Figure 3B:
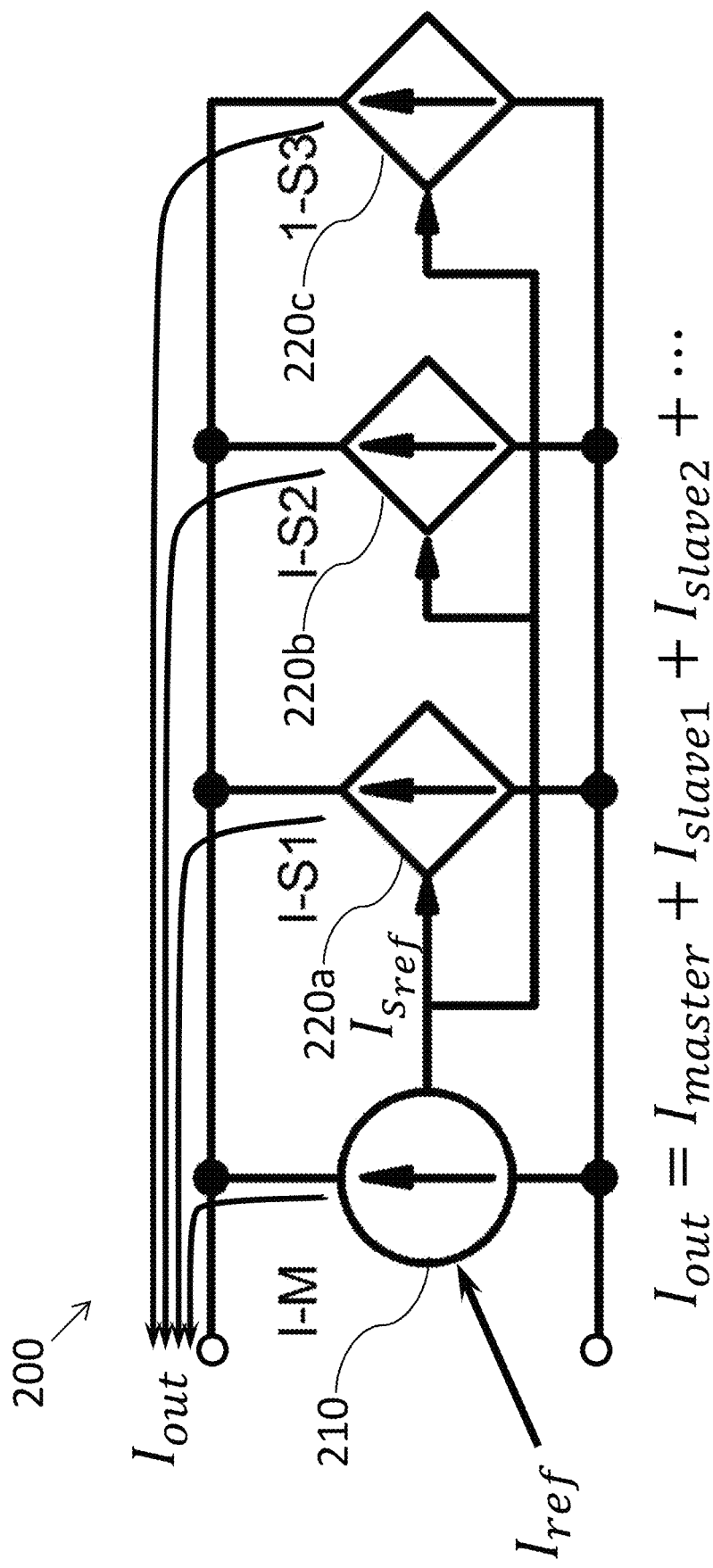
FIG. 3*b* illustrates a basic structure of a master-slave system while operating in CC mode.

FIG. 3b illustrates the basic structure of a master-slave system 200 while operating in CC mode. Here, the user designates the required current within the master unit 210. The master unit then conveys a nominal current $I_{sref}$=$I_{ref}$/n (n is the number of units in the system) which is expected from each slave unit. This signal is conveyed to each slave unit. The master unit also produces to itself a feedback based on comparison between $I_{ref}$ and the actual $I_{out}$. Furthermore, in a preferred embodiment (not shown in FIG. 3b) the master unit conveys to each unit a signal of $I_{av}$ which indicates the value of $I_{out}$/n. Having the values of $I_{sref}$ (which reflects a nominal current) and $I_{av}$ (which reflects an actual average current) each slave unit generates a feedback to itself. In this manner the system provides at the output a constant current, while all units also output the same current. The same technique for obtaining a same output current from each of the units is also used when the system operates in a CV mode.

Figure 4A:
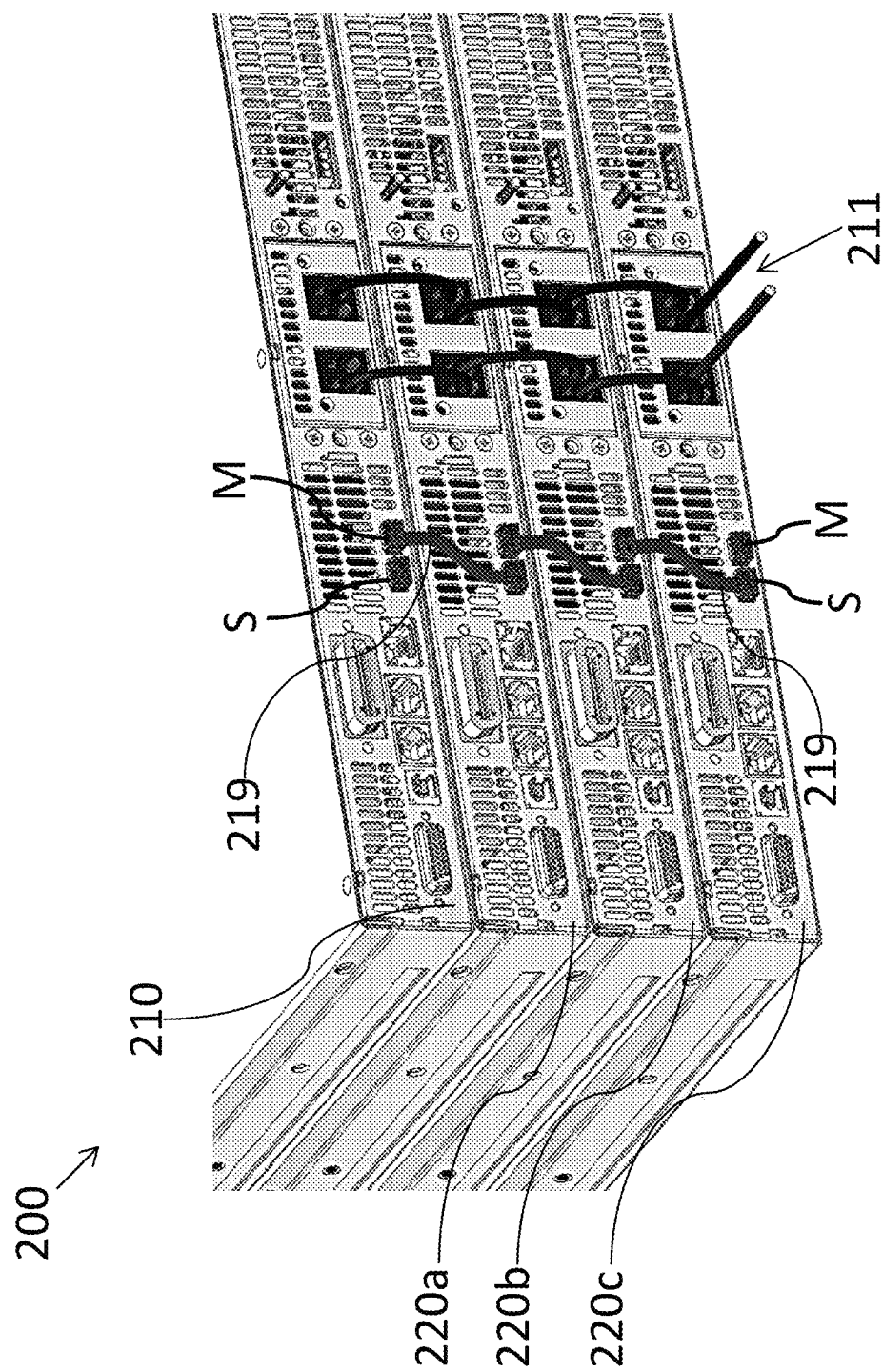
FIG. 4*a* shows an exemplary rear side of a master-slave system of the present invention (4 units are shown)
Figure 4B:
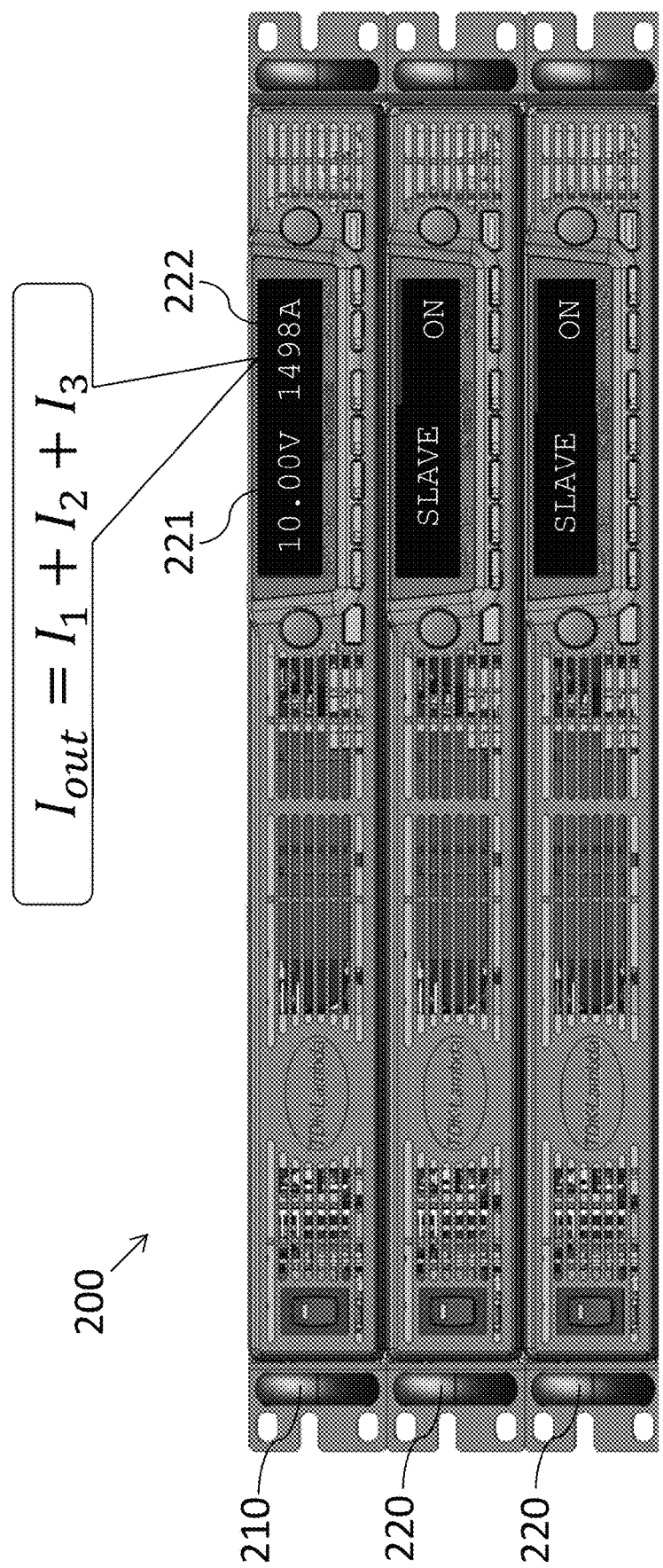
FIG. 4*b* shows an exemplary front of the master-slave system of the present invention (3 units are shown)

FIG. 4a shows the rear side of the master-slave system 200 (4 units are shown), and FIG. 4b shows the front of the master-slave system 200 (3 units are shown). With reference to FIG. 4a, the ± voltage outputs of the master unit 210 and the slave units 220 are all respectively connected together to form the combined output port 211. Each of the units also has an S bus port and an M bus port for connection of a bridging cable 219. As shown, a slave unit is defined in a case when a bridging cable 219 is connected to its S port. A master unit is defined in a case when a bridging cable 219 is connected only to its M port (see unit 210). The last slave unit is defined as the unit to which a bridging cable is connected only to its S port, while its M port remains vacant (see unit 220c). An internal controller within each of the units automatically performs the type of unit definition (master, slave, or last slave) by observing the vacancy and/or connection of the bridging cable/s to said S and M ports of the unit. As shown in FIG. 4b, the reference voltage and reference current 221 and 222 respectively, as specified by the user are displayed at the front panel of the master unit 210. The front panel of each of the slave units 220 shows their status "Slave" and "On".

In a preferred embodiment of the invention, the bridging cable 219 is an 8-pin shielded cable (although different number may also be used, depending on specific embodiments). In one example, the cable comprises the following signals:

a. $FB_M$ signal (2-wires)—This signal which is issued at the master unit 210 by the controller of the master unit carries the voltage feedback [FB=f($V_{ref}$-$V_{out}$)]. This signal is provided simultaneously from the master unit to each of the slave units. This is typically a digital signal.

b. CAN-BUS (2-wires)—This 2-wire bi-directional bus carries (a) indications from the master unit to the slave units such as $I_{ref}$ (the designated current which is expected from each unit), and $I_{av}$ (the measured total current $I_{meas}$ as supplied to the load by the system divided by the number of units n in the system. The CAN-BUS also conveys between the units (b) status and fault indications, such as OVP (Over Voltage Protection indication), OTP (Over Temperature Protection indication), AC FAIL indication. The fault and status signals are also used to assure that all the units in the system are compatible and can be connected together. Upon receipt of one of said failure or status indications, the system may automatically shut down. The CAN-BUS also conveys the current level of each of the slaves, respectively, to the master unit.

c. a hard-wire bus (4 pins)—this bus is used for enabling each unit to determine autonomously whether the unit is a master, a slave, or a last slave, depending on those ports (S and/or M respectively) that are connected at the back-panel of each unit. The hard wire bus also neutralizes the ON/OFF switches of all the slave units, while transferring the central control over all the units of the system to the ON/OFF switch of the master unit.

In one embodiment, in the CV mode of the system 200, the master unit 210 provides to each of the slave units only the FB signal, namely, a voltage feedback. This is sufficient for all the slave units to adjust their outputs to the desired output voltage of the system. In another embodiment, both a voltage feedback and a current feedback are provided over the FB link, such that each of the slave units can dynamically select whether to operate in a CV mode (utilizing the voltage feedback) or in a CC mode (utilizing the current feedback). As noted, a power supply unit operating with a voltage feedback reacts much faster to transients in consumption compared to units that operate in current feedback. Therefore, such a system structure already overcomes the main drawback of the prior art system 100, which is based on current feedback. In still another embodiment, also in the CV mode of operation, the master unit also conveys to each slave the $I_{av}$ value, such that all the units can be balanced also in terms of their output current, namely, each of the units will output the same level of power.

Figure 5:
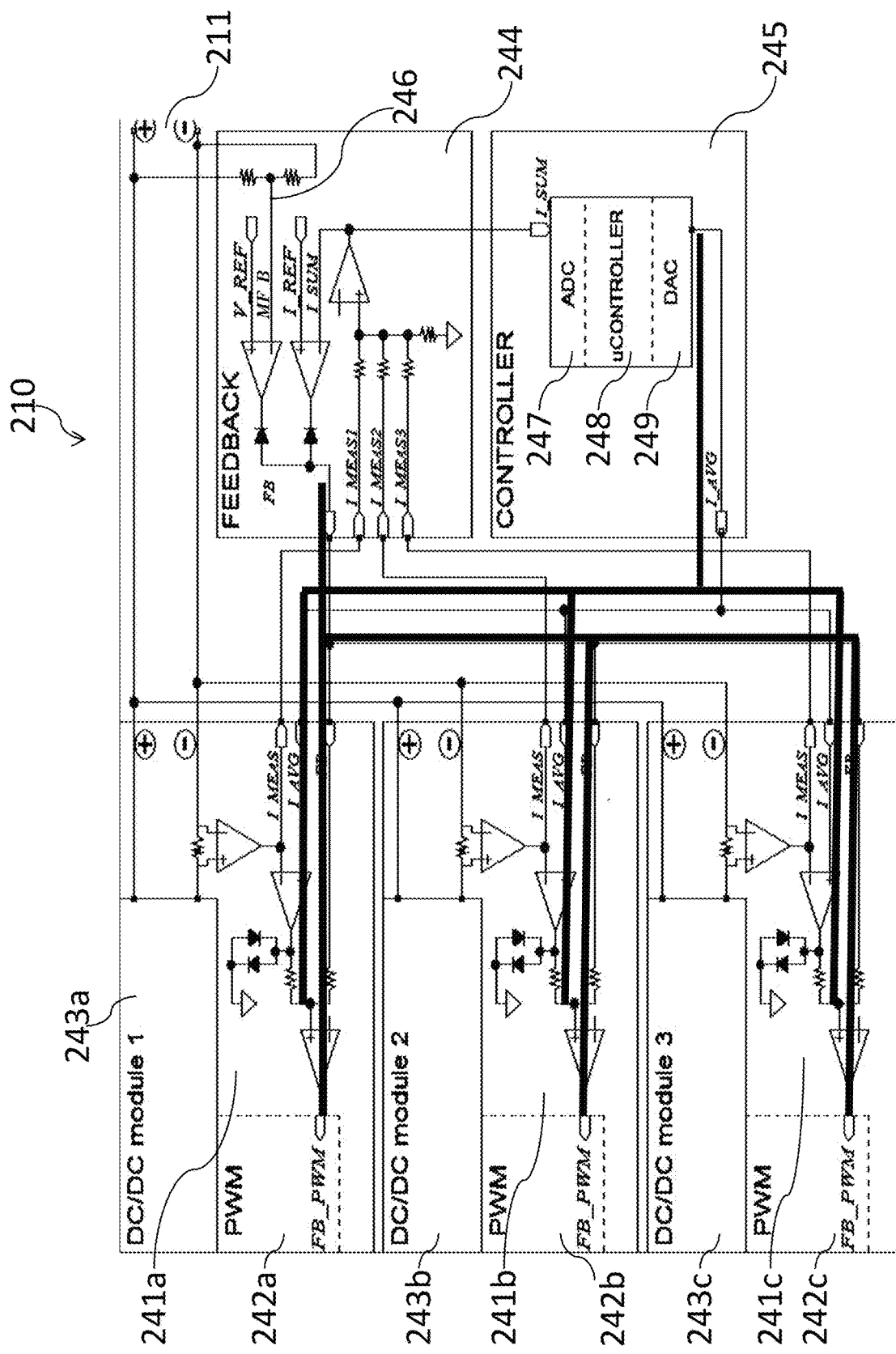
FIG. 5 shows an exemplary internal structure of a power supply unit, when operating as a master, according to an embodiment of the invention.

FIG. 5 shows an exemplary internal structure of a power supply unit, when operating as a master 210, according to an embodiment of the invention. The unit comprises several power modules 241 (three power modules are shown). Each power module comprises a PWM (Pulse Width Modulation) section 242, and a DC to DC section 243. The PWM section feeds the DC/DC section with pulses having a duty cycle suitable for outputting the designate voltage or current, as defined. The unit 210 also comprises a feedback unit 244, and a controller 245. The feedback unit 244 of the master 210 receives a voltage V_REF and/or current reference I_REF, as specified by the user. The voltage feedback (measured from the output voltage 211) to the master unit (MFB) is provided via line 246, and based on this master feedback and V_REF, an internal feedback FB is produced and provided to each of the internal modules in parallel. Each of the power modules 241 produces a current I_MEAS, and combination of all the measured output currents, $I\_MEAS_1$, $I\_MEAS_2$, and $I\_MEAS_3$ produce the current I_SUM which is inserted into µcontroller 248 of controller 245, via an analogue to digital converter 247. The µcontroller 248 in turn calculates an I_AVG signal (namely I_SUM/n, n being the number of modules in unit 210), which is then fed (via a DAC (digital to analogue converter) 249 into each of the PWM modules, in parallel. As a result, each of the unit modules in fact produces a same current and voltage, that are combined at port 211. A similar procedure is performed at each slave unit, however, with external FB signal.

As shown, in CV mode the master unit operates always based on the fast-reacting voltage feedback. In CV mode of the system, all the slave units are also operate based on the fast-reacting voltage feedback mode. Therefore, in CV mode the system reacts to transients much faster compared to the prior system 100. In CC mode of the system 200, the system reaction to transients is somewhat similar to the prior art case of system 100.

In still another embodiment of the invention, each of the slave units includes a decision circuitry for dynamically and autonomously selecting whether to operate in a current feedback mode or in a voltage feedback mode. This is possible, as in the system of the invention voltage feedback is provided from the master to each of the slaves over the line ($FB_M$) of the bridging cable 219. This option provides even more flexible operation compared to the prior art system 100.

Figure 6:
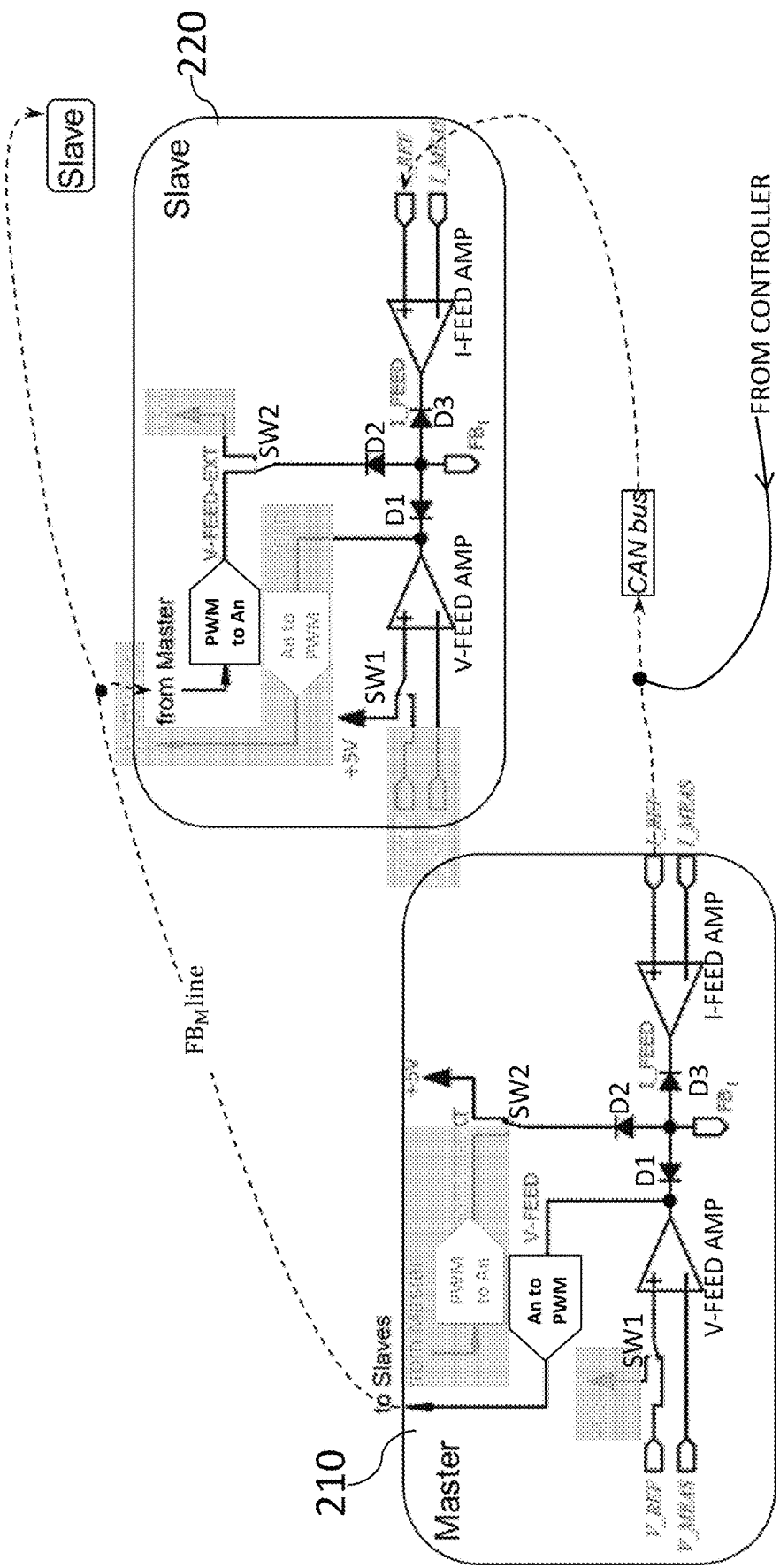
FIG. 6 shows the interaction between a master unit and slave units, particularly with respect to the feedback, and the switching between a CV mode of operation and a CC mode of operation.

FIG. 6 shows the interaction between the master unit and the slave units, particularly with respect to the feedback and the switching between CV mode operation and CC mode operation. Each of the master and the slave units, in fact, comprises an identical ORing-type circuit, whose configuration is automatically set depending on the status of the unit (namely, whether it is a "master", a "slave", or "last slave" unit). More specifically, this configuration defines whether several of the circuit components will become active or inactive in a manner that will be described. Those components that appear in the master and slave circuits of FIG. 6, respectively, in light gray color are inactive components, while the other that appear in dark are active components. As shown, each of the circuits comprises a V-Feed amplifier, an I-Feed amplifier, a 3-diode arrangement, a PWM (Pulse Width Modulation) to An (analog) converter, an Analog to PWM converter, and two switches (namely, SW1 and SW2).

The signal $FB_I$ carries the internal feedback within each of the units, and the ORing-circuit in fact "decides" whether a CV mode or a CC mode will be applied at that unit, and respectively selects which of the voltage or current feedback signals to apply over the $FB_I$ line. The ORing arrangement operates in such a manner that the lowest voltage in a cathode of one of the diodes, compared to the voltage at the other two cathodes will cause the respective diode to conduct, while simultaneously causing the other two diodes to be in a cut-off state. In such a manner, the voltage at the cathode of said conducting diode will be applied to the $FB_I$ line. For example, if at the master unit 210 the output from the V-FEED amplifier is the lowest, the voltage feedback will be applied to the internal $FB_I$ line and therefore the master unit will operate at a CV mode. Alternatively, if the voltage at the output of the I-FEED amplifier will be the lowest, the current feedback from the I-FEED amplifier will be applied to the internal $FB_I$ line, and therefore the master unit will operate at a CC mode.

The two switches SW1 and SW2 define whether the unit will act as a master or a slave, and the controller in fact sets these switches depending on the existence or non-existence of one or two bridging cables at the respective ports at the back panel of the unit, in a manner as discussed above. As can be seen, in the master unit SW1 allows the signal V_REF to enter the V-FEED amplifier, while the switch SW2 connects the cathode of D2 to 5V, therefore this diode is in fact neutralized. Independent from any state of the ORing circuit, the signal V-FEED (voltage feedback) from the output of the V-FEED amplifier is provided into the An to PWM module, which in turn outputs the voltage signal over the $FB_M$ line (voltage feedback issued by the master unit and sent to external units) line. The $FB_M$ line leads the voltage feedback to each of the slave units in parallel.

On the other hand, the switches SW1 and SW2 at each of the slave units are set as shown (different than their respective states at the master unit). SW1 is connected to the 5V supply, causing a constant high voltage at the output of the slave's unit V-FEED amplifier. This high voltage in fact neutralizes the operation of the V-FEED amplifier. The ORing arrangement will therefore apply either: (a) an external voltage feedback as coming to the unit from the $FB_M$ line (and via the PWM to An module); or (b) the current feedback as coming from the I-FEED amplifier (and which depends on the comparison between the external I_REF signal and the I_MEAS signal). Of course, and as previously mentioned, the lowest voltage among the two will govern the signal which will be applied to the $FB_I$ line, and therefore also the mode of operation of the unit (namely either CV or CC mode). It should be noted that when the current consumption by the load exceeds the defined $I_{REF}$ value, the output voltage of the system begins to decrease, and at that stage the unit switches to a CC mode of operation to keep the current at the limit of $I_{REF}$, as defined.

EXAMPLE

Figure 7:
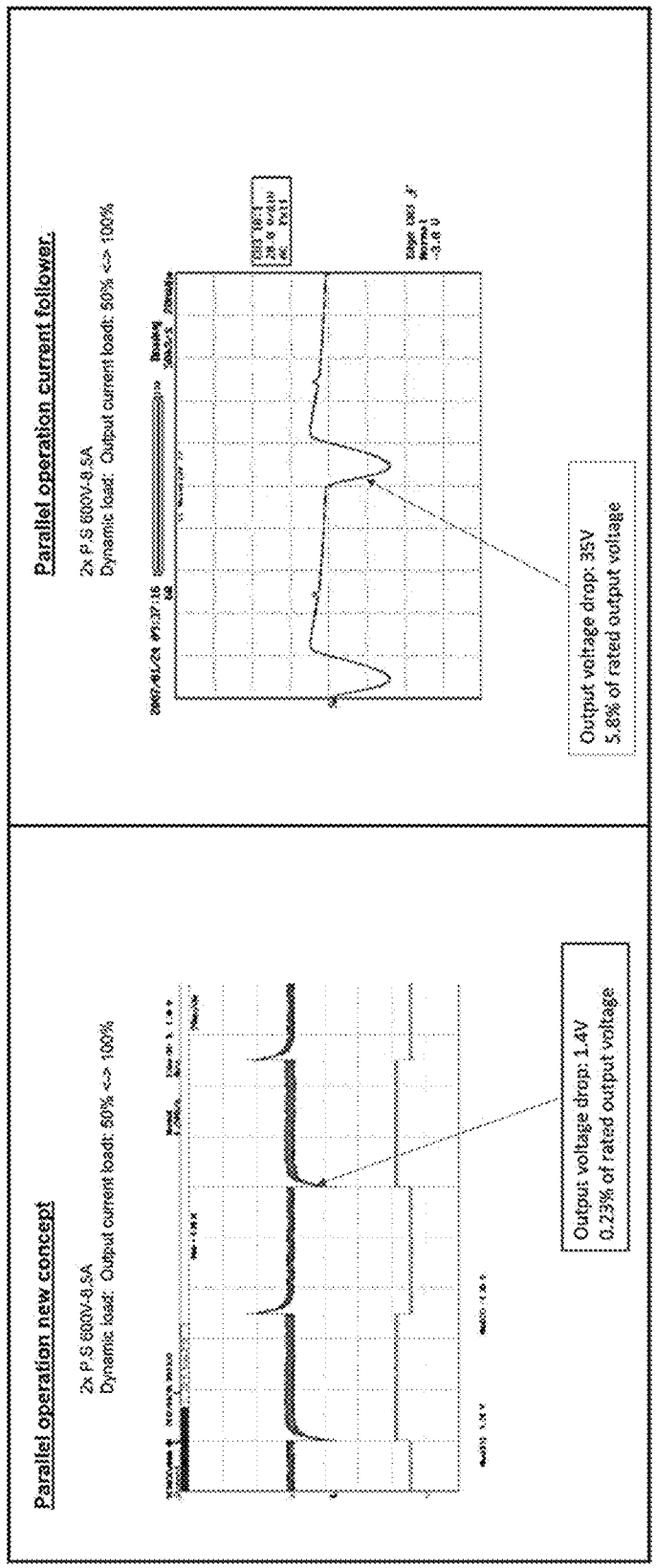
FIG. 7 shows a comparison between a system in which all the units (the master unit and the slave units) operate in a voltage feedback mode according to the present invention and between a system according to the prior art in which the master unit operates in a voltage feedback mode while the slave units operate in a current-feedback mode.

FIG. 7 shows a comparison between a system in which all the units (the master unit and the slave units) operate in a voltage feedback mode according to the present invention and between a system according to the prior art in which the master unit operates in a voltage feedback mode while the slave unit operates in a current-feedback mode. As shown, both of said systems used two power supplies (one master unit and one slave unit). The system was adjusted to supply 600V and maximum current of 17 A (2×8.5 A). The dynamic setting of the load was identical, namely 50% to 100% of the maximal current. As can be seen, while the system of the present invention suffered a drop of 1.4V (namely 0.23% of the rated output voltage), the prior art system suffered a voltage drop of 35V (namely 5.8% of the rated output voltage). It can be seen that according to this example, the system of the present invention provides a 25 times improvement

The invention claimed is:

1. A master-slave power supply system, which comprises:
   (a) a master power supply unit having an output power port; and
   (b) one or more slave units, each of the one or more slave units having its own output power port,
   wherein the output power port of the master power supply unit, as well as the output port of all the one or more slave units are connected in parallel,
   wherein a bridging cable connects between the master power supply unit and a first slave unit, and additional bridging cables connect respectively each of the one or more slave units to a next one, until a last slave unit,
   wherein each of the one or more slave units is operable in either a current feedback mode or in a voltage feedback mode,
   wherein at least a voltage feedback signal is conveyed from the master power supply unit to all the one or more slave units in parallel over the additional bridging cables,
   wherein each of the one or more slave units further comprises decision circuitry for dynamically and autonomously selecting, using an internal controller, whether to operate in the current feedback mode or in the voltage feedback mode.

2. The master-slave power supply system according to claim 1, wherein either the master power supply unit or the one or more slave units has an S bus port and an M bus port, and is automatically defined by the internal controller as "master", "slave", or "last slave" depending on when said bridging cable is connected only to its M bus port, to its S port, and only to its S port while its M port remains vacant, respectively.

3. The master-slave power supply system according to claim 1, wherein at a CV (constant voltage) mode of operation, each of the one or more slave units regulates its own output voltage, which is supplied to its output power port based on the voltage feedback signal which is received from the master power supply unit.

4. The master-slave power supply system according to claim 1, wherein the additional bridging cables also convey a reference current signal from the master power supply unit to each of the one or more slave units, for use in a CC (constant current) mode of operation.

5. The master-slave power supply system according to claim 1, wherein the decision circuitry is an ORing circuit enabling each of the one or more slave units to autonomously decide whether to operate in a CV mode or in a CC mode, wherein the master power supply unit also comprises the ORing circuit, the ORing circuit being configured differently at the master power supply unit compared to a respective configuration of the ORing circuit at each of the one or more slave units.

6. The master-slave power supply system according to claim 5, wherein at each of the one or more slave units, the autonomous decision depends, among others, on a level of the voltage feedback signal which is received from the master power supply unit.

7. The master-slave power supply system according to claim 5, wherein, at the master power supply unit, the autonomous decision depends on a level of the voltage feedback signal which is also sent to each of the one or more slave units and on a level of an internal current feedback.

8. The master-slave power supply system according to claim 1, wherein the master power supply unit also conveys to each of the one or more slave units an average current signal, notifying the one or more slave units a current level which is expected from either the master power supply unit or the one or more slave units.

9. The master-slave power supply system according to claim 1, wherein the master power supply unit and each of the one or more slave units comprises a plurality of internal power modules, and wherein a controller at either the master power supply unit or the one or more slave units calculates an internal average current for each of the plurality of internal power modules.

10. The master-slave power supply system according to claim 1, wherein the master power supply unit calculates a unit average current for each of the one or more slave units, the unit average current is calculated based on a measured output current that each of the one or more slave units conveys to the master power supply unit.

11. The master-slave power supply system according to claim 10, wherein the master power supply unit displays a total current of the master-slave power supply system based on the measured output currents of each of the one or more slave units, and its own output current.

12. The master-slave power supply system according to claim 1, wherein the additional bridging cables also convey status and fault signals between the master power supply unit and the one or more slave units.

13. The master-slave power supply system according to claim 1, wherein a setting of the master-slave power supply system, as well as readback from the master-slave power supply system refers to the master-slave power supply system as a single unit regardless of a number of slave units connected.

14. The master-slave power supply system according to claim 1, wherein a setting at each one or more slave unit is inhibited, enabling setting of the master-slave power supply system only at the master power supply unit.

15. The master-slave power supply system according to claim 1, wherein data and/or feedback exchange between either the master power supply unit or the one or more slave units is performed either in a wired form or wirelessly.

16. The master-slave power supply system according to claim 1, wherein current feedback between either the master power supply unit or the one or more slave units is exchanged either in a digital manner or in an analogue manner.

17. The master-slave power supply system according to claim 1, wherein an ON/OFF power switch of each of the one or more slave units is inhibited based on the additional bridging cables, or based on a wireless digital signal which is conveyed from the master power supply unit to each of the one or more slave units.

18. The master-slave power supply system according to claim 1, wherein an identification of each of master power supply unit or the one or more slave units is performed based on the additional bridging cables, or based on a wireless digital signal which is conveyed from the master power supply unit to each of the one or more slave units.

19. The master-slave power supply system according to claim 1, wherein the additional bridging cables also convey:
   a. a reference current signal from the master power supply unit to each of the one or more slave units, a magnitude of said reference current signal being reflective of an expected number of slave units provided in the master-slave power supply system in response to each conveyed status signal;
   b. a measured output current from each of the one or more slave units to the master power supply unit based on an actual number of slave units provided in the master-slave power supply system, which the master power supply unit compares with the reference current signal; and
   c. a unit average current from the master power supply unit to each of the one or more slave units if the measured output current is unequal to the reference current signal, by which each of the one or more slave units generates a feedback to itself so that the master-slave power supply system automatically configures itself into a scalable master-slave power supply system without human intervention such that it provides a constant current at the output while all of the one or more slave units outputs a same current, wherein the unit average current is based on the measured output current.

* * * * *